(12) United States Patent  (10) Patent No.: US 9,195,560 B2
Nomura et al.  (45) Date of Patent: Nov. 24, 2015

(54) DEVICE AND METHOD FOR CALCULATING BATTERY USABLE TIME PERIOD FOR MOBILE STATION

(75) Inventors: Naoji Nomura, Chiyoda-ku (JP); Yasuyuki Kanai, Chiyoda-ku (JP)

(73) Assignee: NTT DOCOMO, INC., Tokyo (JP)

( * ) Notice: Subject to any disclaimer, the term of this patent is extended or adjusted under 35 U.S.C. 154(b) by 187 days.

(21) Appl. No.: 13/820,784

(22) PCT Filed: Jan. 13, 2012

(86) PCT No.: PCT/JP2012/050627
§ 371 (c)(1),
(2), (4) Date: Mar. 5, 2013

(87) PCT Pub. No.: WO2012/096383
PCT Pub. Date: Jul. 19, 2012

(65) Prior Publication Data
US 2013/0173947 A1    Jul. 4, 2013

(30) Foreign Application Priority Data
Jan. 14, 2011 (JP) ................... 2011-006052

(51) Int. Cl.
*G06F 11/30* (2006.01)
*G01R 31/36* (2006.01)
*H04W 52/02* (2009.01)

(52) U.S. Cl.
CPC ........ *G06F 11/3062* (2013.01); *G01R 31/3613* (2013.01); *H04W 52/0258* (2013.01); *G01R 31/3689* (2013.01); *H04W 52/0261* (2013.01); *Y02B 60/50* (2013.01)

(58) Field of Classification Search
CPC ...... G06F 11/3062; G06F 11/30; H04M 1/00; G01R 31/36
USPC ................... 455/161.1, 552.1, 574, 566, 572; 702/63; 713/340
See application file for complete search history.

(56) References Cited

U.S. PATENT DOCUMENTS 6,484,110 B1 * 11/2002 Jung ............................. 702/63
2003/0034779 A1 * 2/2003 Juncker et al. ............... 324/426

(Continued)

FOREIGN PATENT DOCUMENTS

CN    101808165 A    8/2010
FR    2 857 195 A1    1/2005

(Continued)

OTHER PUBLICATIONS

Extended Search Report issued Feb. 6, 2014 in European Patent Application No. 12734299.6

(Continued)

*Primary Examiner* — Kashif Siddiqui
*Assistant Examiner* — Minjung Kim
(74) *Attorney, Agent, or Firm* — Oblon, McClelland, Maier & Neustadt, L.L.P.

(57) ABSTRACT

A device includes a retrieval unit that retrieves information regarding usage conditions including operating time periods indicating extents of utilizing corresponding plural functions included in a mobile station by a user; a storing unit that stores, for each of operating mode of the mobile station, average consumed current values for the corresponding plural functions; a calculating unit that calculates, for each of the operating modes, a battery usable time period by calculating an added value, the added value being obtained by adding a product of the average consumed current value for one of the functions and the operating time period of the one of the functions over the plural functions, and by dividing a capacity value of a battery included in the mobile station by the added value; and a display unit that displays the battery usable time periods to the user.

12 Claims, 22 Drawing Sheets

(56) References Cited

U.S. PATENT DOCUMENTS

| | | | |
|---|---|---|---|
| 2008/0070495 A1* | 3/2008 | Stricklen et al. | 455/3.01 |
| 2008/0261662 A1 | 10/2008 | Ashbrook et al. | |
| 2009/0068969 A1* | 3/2009 | Lindoff et al. | 455/161.1 |
| 2009/0164152 A1 | 6/2009 | Creus et al. | |
| 2009/0239574 A1* | 9/2009 | Hussain | 455/552.1 |
| 2010/0178900 A1* | 7/2010 | Cheng et al. | 455/414.1 |
| 2011/0301890 A1* | 12/2011 | Shirriff et al. | 702/63 |

FOREIGN PATENT DOCUMENTS

| | | |
|---|---|---|
| GB | 2 448 534 A | 10/2008 |
| JP | 2002 7002 | 1/2002 |
| JP | 2003 101466 | 4/2003 |
| JP | 2004 56563 | 2/2004 |
| JP | 2006 226788 | 8/2006 |
| JP | 2010 56954 | 3/2010 |
| JP | 2010 278645 | 12/2010 |
| WO | WO 2005/006722 A2 | 1/2005 |

OTHER PUBLICATIONS

Combined Office Action and Search Report issued Sep. 19, 2014 in Chinese Patent Application No. 201280003393.0 (with English translation).

Chinese Office Action for patent application No. 201280003393.0 mailed Apr. 20, 2015 with English translation.

Japanese Office Action Issued Aug. 21, 2012 in JP Patent Application No. 2011-006052 Filed Jan. 14, 2011 (with English translation).

International Search Report Issued Feb. 7, 2012 in PCT/JP12/50627 Filed Jan. 13, 2012.

Extended Search Report issued Feb. 6, 2014 in European Patent Application No. 12734299.6.

* cited by examiner

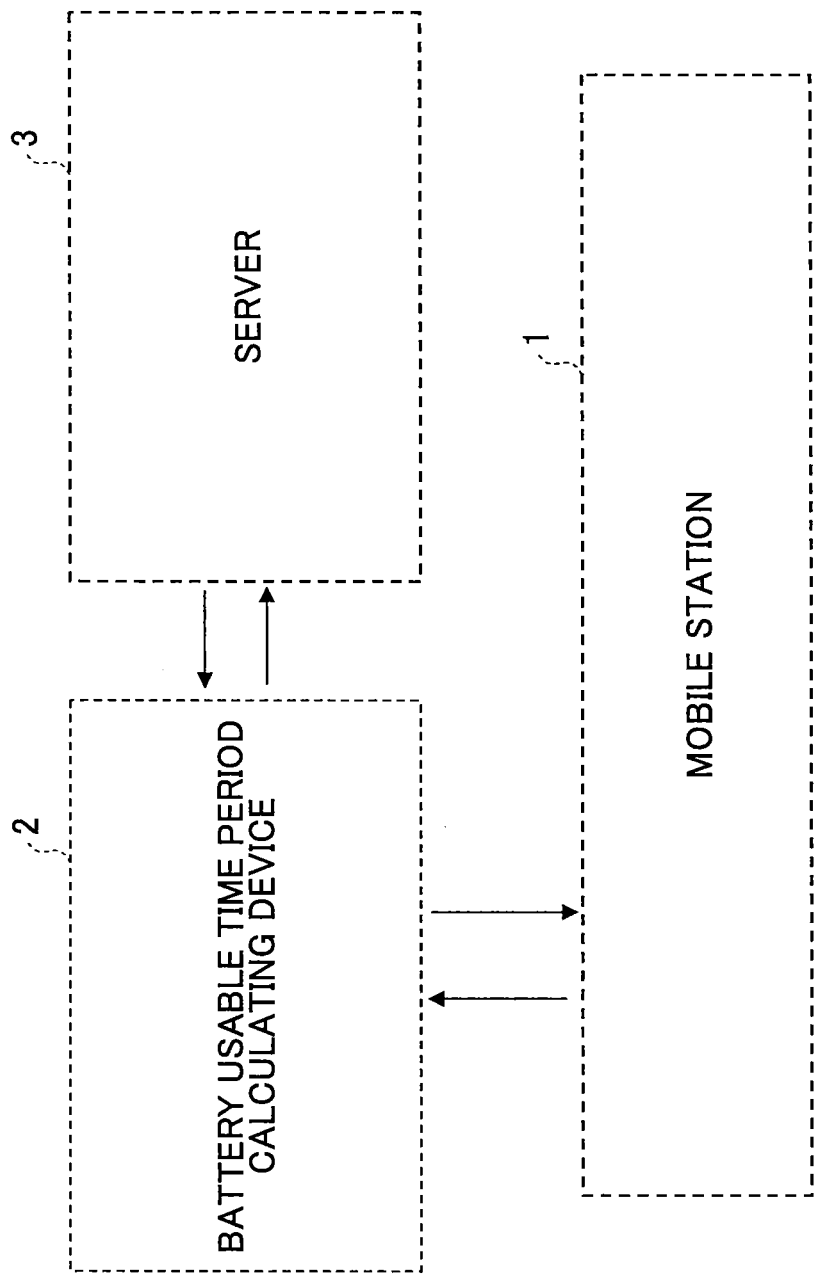

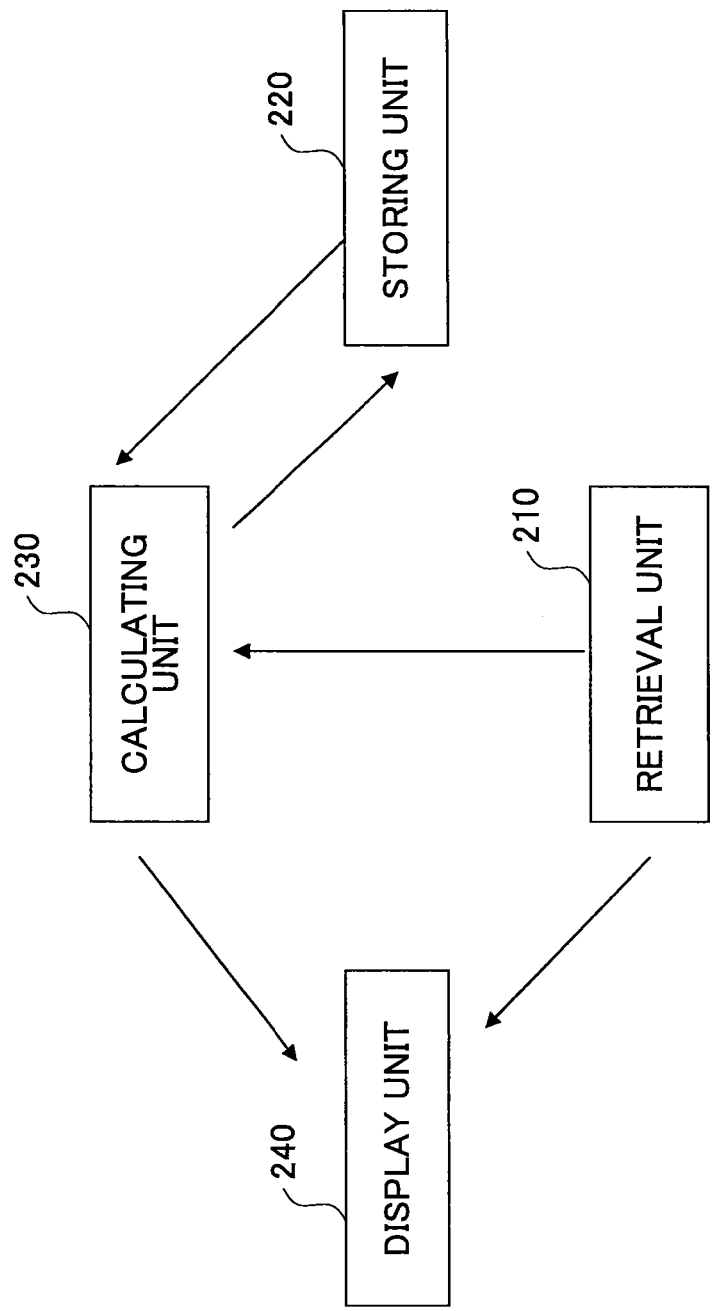

FIG.3

[INPUT SCREEN]

PLEASE INPUT USAGE CONDITIONS OF MOBILE STATION PER ONE DAY.

Q. DURATION OF CALL?
[ 0 ] MINUTES

Q. VIEWING TIME PERIOD OF ONE SEG?
[ 0 ] MINUTES

Q. NUMBER OF TIMES OF USING CONCIERGE SERVICES?
[ 0 ] TIMES/WEEK

Q. AMOUNT OF TRANSMITTING MAILS?
[ 0 ] TIMES

Q. TIME PERIOD FOR PLAYING GAME?
[ 0 ] MINUTES

Q. AUTOMATIC GPS FUNCTION UTILIZED?
◉ YES   ● NO

Q. AMOUNT OF RECEIVING MAILS?
[ 0 ] TIMES

Q. TIME PERIOD FOR LISTENING TO MUSIC?
[ 0 ] MINUTES

FIG.4

[INPUT SCREEN]

PLEASE INPUT USAGE CONDITIONS OF MOBILE STATION PER ONE DAY.

Q. DURATION OF CALL?  [ 7 ] MINUTES

Q. VIEWING TIME PERIOD OF ONE SEG?  [ 20 ] MINUTES

Q. NUMBER OF TIMES OF USING CONCIERGE SERVICES?  [ 2 ] TIMES/WEEK

Q. AMOUNT OF TRANSMITTING MAILS?  [ 5 ] TIMES

Q. TIME PERIOD FOR PLAYING GAME?  [ 60 ] MINUTES

Q. AUTOMATIC GPS FUNCTION UTILIZED?  ○ YES  ● NO

Q. AMOUNT OF RECEIVING MAILS?  [ 10 ] TIMES

Q. TIME PERIOD FOR LISTENING TO MUSIC?  [ 30 ] MINUTES

FIG.5

| FUNCTIONS OF MOBILE STATION | AVERAGE CONSUMED CURRENT VALUES (mA) | |
|---|---|---|
| | NORMAL MODE | POWER SAVING MODE |
| CALLING | 150 | 130 |
| MAIL TRANSMITTING | 100 | 80 |
| MAIL RECEIVING | 120 | 90 |
| MUSIC PLAYING | 50 | 40 |
| ONE SEG | 200 | 150 |
| ... | ... | ... |

[BATTERY USABLE TIME PERIOD CALCULATING DEVICE]

FIG.10

| FUNCTIONS OF MOBILE STATION | MODEL CASE 1 | MODEL CASE 2 | MODEL CASE 3 | MODEL CASE 4 |
|---|---|---|---|---|
| CALLING | 6 MINUTES/DAY | 7 MINUTES/DAY | 7 MINUTES/DAY | 5 MINUTES/DAY |
| MAIL TRANSMITTING | 6 TIMES/DAY | 11 TIMES/DAY | 4 TIMES/DAY | 7 TIMES/DAY |
| MAIL RECEIVING | 9 TIMES/DAY | 16 TIMES/DAY | 10 TIMES/DAY | 10 TIMES/DAY |
| SITE BROWSING | 17 MINUTES/DAY | 25 MINUTES/DAY | 13 MINUTES/DAY | 16 MINUTES/DAY |
| ONE SEG USING | 11 MINUTES/DAY | 13 MINUTES/DAY | 9 MINUTES/DAY | 8 MINUTES/DAY |
| GAME PLAYING | 5 MINUTES/DAY | 5 MINUTES/DAY | 7 MINUTES/DAY | 6 MINUTES/DAY |
| MUSIC LISTENING/MOVIE VIEWING | 6 MINUTES/DAY | 7 MINUTES/DAY | 7 MINUTES/DAY | 9 MINUTES/DAY |
| CONCIERGE SERVICE UTILIZING | 2 TIMES/WEEK | 2 TIMES/WEEK | 2 TIMES/WEEK | 2 TIMES/WEEK |

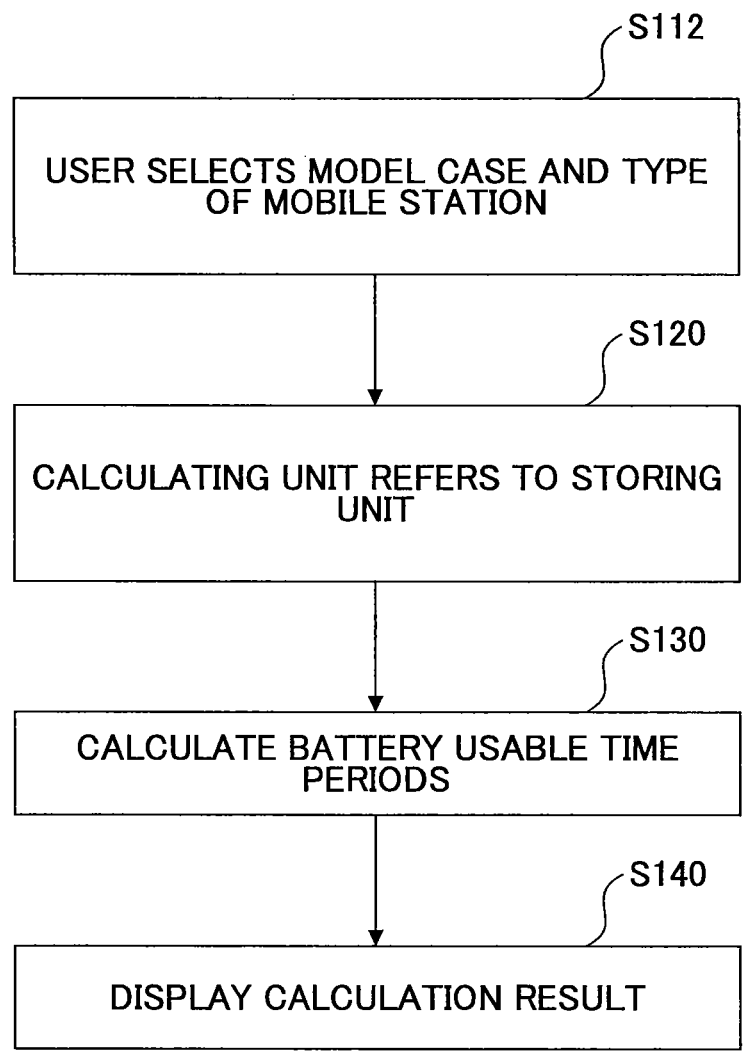

FIG.13

| FUNCTIONS OF MOBILE STATION | OPERATING TIME PERIOD OR TIMES/DAY |
|---|---|
| CALLING | 20 (MINUTES) |
| MAIL TRANSMITTING | 10 (TIMES) |
| MAIL RECEIVING | 15 (TIMES) |
| MUSIC PLAYING | 12 (MINUTES) |
| ONE SEG | 18 (MINUTES) |
| ... | ... | de# DEVICE AND METHOD FOR CALCULATING BATTERY USABLE TIME PERIOD FOR MOBILE STATION

TECHNICAL FIELD

The present invention relates to a device and a method for calculating a battery usable time period for a mobile station.

BACKGROUND ART

As mobile stations are multi-functionalized, ways of using the mobile stations by users are diversified. The mobile stations are represented by mobile phones. Whereas, operators are providing benefits to the users by offering various charge plans to the users.

There has been introduced a system that simulates monthly charge plans for mobile phone subscribers as a web service or at a store. When a subscriber is to purchase a mobile phone or to decide or change a charge plan, the subscriber may find a charge plan that is suitable for the subscriber in advance by performing the simulation. For purchasing a mobile phone and for deciding on a charge plan, one of important matters of concern for the subscriber is how long a battery of the mobile station can be used, namely, "the battery usable time period." Patent Document 1, for example, discloses a conventional technique for calculating a remaining amount of the battery usable time period.

RELATED ART DOCUMENT

Patent Document

Japanese Patent Laid-Open Application No. 2003-101466

SUMMARY OF THE INVENTION

Problem to be Solved by the Invention

Operating modes of a mobile station are not limited to one mode. As typical examples, there are a normal mode and a power saving mode. The power saving mode is a mode where the mobile station operates to reduce power consumption, for example, by darkening a display screen. The power saving mode is different from a standby idle mode. These operating modes significantly affect the battery usable time period. Unfortunately, a conventional method of calculating the battery usable time period does not distinguish the normal mode and the power saving mode, and the conventional method of calculating the battery usable time period assumes the normal mode. Accordingly, the problem is that, with the conventional method of calculating the battery usable time period, it is not possible to find the battery usable time period while distinguishing the normal mode from the power saving mode.

Among the mobile stations of recent years, there are many mobile stations that are capable of communicating in plural networks. In this case, the battery usable time period may not be the same, depending on the networks. Unfortunately, in the conventional method of calculating the battery remaining time, it is not possible to consider serving networks.

The problem is that it is not possible to accurately calculate the battery usable time period of the mobile station with the conventional method.

A problem of the present invention is to accurately calculate a battery usable time period of a mobile station, depending on a usage condition of the mobile station by a user.

Means for Solving the Problem

A device according to one embodiment is a device including a retrieval unit that retrieves information regarding usage conditions including operating time periods, the operating time periods indicating extents of utilizing corresponding plural functions included in a mobile station by a user; a storing unit that stores, for each of operating modes of the mobile station, average consumed current values for the corresponding plural functions; a calculating unit that calculates, for each of the operating modes, a battery usable time period by calculating an added value, the added value being obtained by adding a product of the average consumed current value for one of the functions and the operating time period of the one of the functions over the plural functions, and by dividing a capacity value of a battery included in the mobile station by the added value; and a display unit that displays the battery usable time periods of the mobile station to the user.

Effect of the Present Invention

According to one embodiment, the battery usable time period of the mobile station can be accurately calculated, depending on the usage condition of the mobile station by the user.

BRIEF DESCRIPTION OF THE DRAWINGS

FIG. 1 is a schematic diagram of a system that is used for calculating a battery usable time period;

FIG. 2 is a functional block diagram of a battery usable time period calculating device in a basic embodiment;

FIG. 3 is a diagram (prior to an input) showing an input screen for a user to input information regarding usage conditions;

FIG. 4 is a diagram (subsequent to the input) showing the input screen for the user to input the information regarding the usage conditions;

FIG. 5 is a diagram showing one example of average consumed current values stored in a storing unit;

FIG. 10 is a diagram showing specific examples of the model cases;

FIG. 11 is a flowchart showing an example of operations in the modified example;

FIG. 13 is a diagram showing information stored in a mobile station internal storing unit;

EMBODIMENTS FOR CARRYING OUT THE INVENTION

Figure 6:
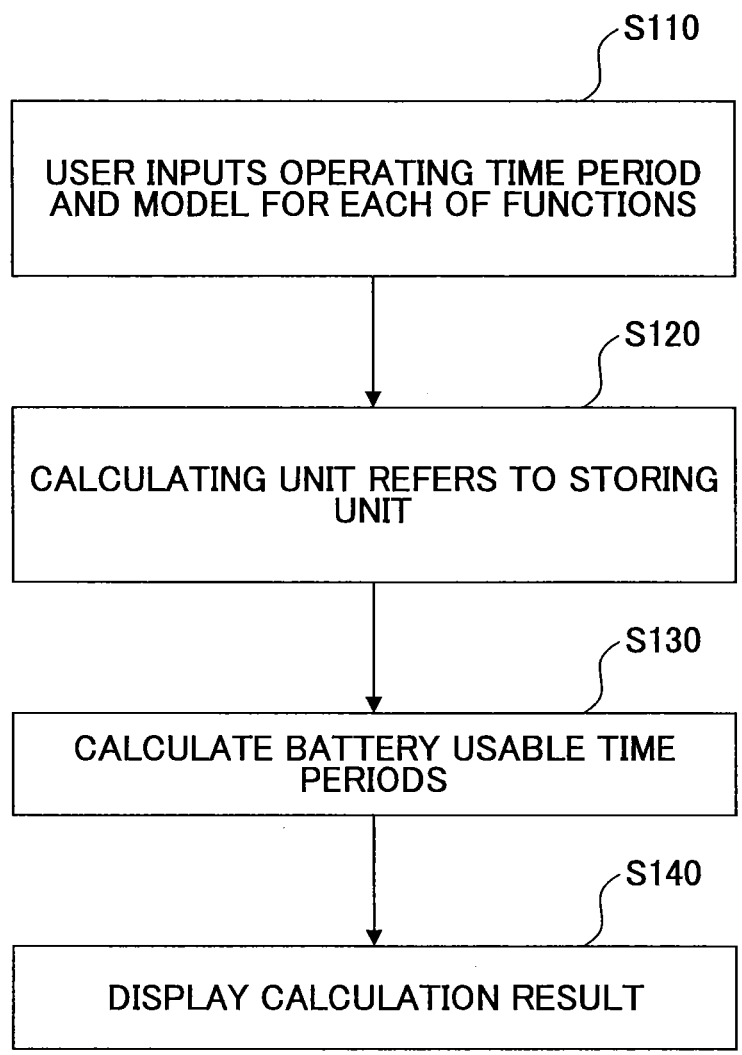
FIG. 6 is a flowchart showing an example of operations in the basic embodiment.

According to an embodiment described below, for each of operating modes (e.g., a normal mode and a power saving mode) and for each of networks, average consumed current values of corresponding functions of a mobile station are stored in advance in a storing unit of a system. By directly inputting an operating time period of each of the functions by a user, or by referring to a storing unit of the mobile station by the system, the system finds, for example, a usage trend per one day, and thereby the system can calculate a battery usable time period of the mobile station corresponding to the usage trend.

According to the embodiment, the battery usable time period of the mobile station for the power saving mode, besides the battery usable time period of the mobile station for the normal mode, can be estimated or can be simulated. In this regard, it is significantly different from a conventional method where such an estimation is not performed. By showing the battery usable time periods while separating a case of the normal mode from a case of the power saving mode, an effect of the power saving mode can be effectively demonstrated to the user. According to the embodiment, the battery usable time period can be calculated even for a mobile station having a function to automatically switch from the normal mode to the power saving mode, depending on a remaining amount of the battery energy. For a case where the battery is deteriorated as a result of repeatedly performing charging and discharging for a long time, the battery usable time period of the mobile station can be more accurately calculated by considering an extent of the deterioration. By showing the extent of the deterioration of the battery, replacement of the battery or replacement of the mobile station can be prompted. Further, by examining, for each of the networks, the average consumed current values of the corresponding functions in advance, and by calculating the battery usable time period for each of the networks, the battery usable time period can be calculated more accurately.

The embodiment is explained from the following viewpoints.

1. Basic embodiment
2. Functional distribution
3. User input assistance by using a model case
4. Use history information of mobile station
5. Comparison of mobile stations
6. Mobile station having an operating mode automatic switching function
7. Deterioration of the battery
8. Serving networks

First Embodiment

1. Basic Embodiment

FIG. 1 shows a system or a device that is used for calculating the battery usable time period. The system or the device includes a mobile station 1; a battery usable time period calculating device 2; and a server 3.

The mobile station 1 is a communication terminal or user equipment whose power is supplied from a battery. The mobile station 1 can perform various functions. The mobile station 1 is, for example, a mobile phone, an information terminal, a high-performance mobile phone, a smart phone, a personal digital assistant, or a mobile personal computer. The mobile station 1 is not limited to these.

The battery usable time period calculation device 2 calculates the battery usable time period by various methods (which are described later), and the battery usable time period calculation device 2 provides the battery usable time period to the user.

The server 3 is not mandatory. The server 3 assists calculation of the battery usable time period, depending on necessity. This point is explained in "2. Functional distribution."

FIG. 2 shows a functional block diagram of the battery usable time period calculating device 2 in the basic embodiment of the system shown in FIG. 1. The battery usable time period calculating device 2 includes a retrieval unit 210; a storing unit 220; a calculating unit 230; and a display unit 240.

The retrieval unit 210 retrieves "information regarding usage conditions" including operating time periods indicating extents of using, by the user, the corresponding functions included in the mobile station 1. In general, "the information regarding the usage conditions" represents numerical values or setting conditions that affect the battery usable time period of the mobile station. For example, "the information regarding the usage conditions" includes information such as duration of a call; a number of times of sending mails; a number of times of receiving mails; a time period of viewing movies such as one seg; a time period of playing games; a time period of listening to music; and a setting (ON/OFF) of an automatic GPS function. The information regarding the usage conditions is not limited to these. Additionally, the information regarding the usage conditions may include information for identifying the mobile station; a threshold value of a remaining battery capacity at which the normal mode switches to the power saving mode; a deteriorated amount of the battery; and types of networks, for example. The information regarding the usage conditions may be input by the user, or the information regarding the usage conditions may be retrieved from the mobile station 1.

FIGS. 3 and 4 show an example of an input screen for the user to input the information regarding the usage conditions. FIG. 3 shows a condition prior to an input. FIG. 4 shows a condition subsequent to the input. By displaying the input screen such as shown in FIG. 3, the user of the mobile station 1, which is a mobile phone, for example, is prompted to input the information regarding the usage conditions, such as operating time periods, a number of times, and setting conditions. As an example, it is prompted to input information per one day. However, a unit of the time interval may not be one day.

In general, the storing unit 220 of FIG. 2 stores, in advance, fixed values used for calculating the battery usable time period. Specifically, the storing unit 220 stores, at least for each of the operating modes of the mobile station, the average consumed current values of the corresponding plural functions. In a modified example described later, such average consumed current values are stored for each of the networks. The storing unit 220 also stores a capacity value of the battery included in the mobile station. An operator or the like knows as to what battery (a battery pack) is attached to the mobile station. The above-described retrieval unit 201 retrieves variable values (the information regarding usage conditions) that are used for calculating the battery usable time period. Typically, the operating modes include the normal mode and the power saving mode. However, there may be more than two operating modes. The power saving mode is a mode where the power consumption is reduced by darkening the screen, compared to a case of the normal mode, such as a screen saver.

FIG. 5 shows an example of the average consumed current values stored in the storing unit 220. The average consumed current values are information possessed by a network side or the operator. The battery usable time period calculation device 2 can retrieve the information regarding the average consumed current values by accessing a server of such an operator.

The calculating unit 230 of FIG. 2 calculates the battery usable time period for each of the operating modes. Specifically, the calculating unit 230 calculates the battery usable time period by obtaining an added value which is obtained by adding a product of the average consumed current value for one of the functions and the operating time period of the one of the functions over the plural functions, and by dividing a capacity value of the battery of the mobile station by the added value.

(The battery usable time period)=(the capacity value of the battery)/($\Sigma$[(the average consumed current value of the function)×(the operating time period of the function)]). Here, $\Sigma$ represents a summation over all the functions included in the mobile station.

The display unit 240 displays the battery usable time period of the mobile station, which is calculated by the calculating unit 230.

FIG. 6 shows an operation flow for calculating the battery usable time period.

At step S110, the retrieval unit 210 prompts the user to input the information regarding the usage conditions, and in response to this, the user inputs the information. For example, the user inputs the operating time period for each of the functions and model information of the mobile station.

At step S120, the calculating unit 230 retrieves the fixed values (e.g., the average consumed current values of the corresponding functions) which are used for calculating the battery usable time period from the storing unit 220.

At step S130, the calculating unit 230 calculates the battery usable time period for each of the operating modes. As described above, the battery usable time period is calculated by the following formula, for example.

(The battery usable time period)=(the capacity value of the battery)/($\Sigma$[(the average consumed current value of the function)×(the operating time period of the function)]). For example, suppose that the capacity value of the battery is 800 mAh, and the operating time period and the average consumed current value of each of the functions are as follows.

Voice communication function: operating time period=20 minutes/day, average consumed current value=150 mA.

Mail transmitting function: 10 times/day, average consumption per one time=5 mAh.

Mail receiving function: 15 times/day, average consumption per one time=2 mAh.

Standby time: 1400 minutes/day, average consumed current value=1.0 mA.

In this case, the battery usable time period can be calculated as follows.

The battery usable time period (h)=800 (mAh)/(20×150/60+10×5+15×2+1400×1.0/60)×24≈125 (h)

As shown in FIG. 5, the average consumed current values are different depending on the operating modes. Accordingly, the battery usable time period is calculated for each of the operating modes.

At step S140 of FIG. 6, the display unit 240 displays the calculation result at step S130 to the user. In this manner, the user can find the battery usable time period for each of the operating modes.

2. Functional Distribution

It is not mandatory that all the retrieval unit 210, the storing unit 220, the calculating unit 230, and the display unit 240, which are shown in FIG. 2, are included in the battery usable time period calculating device 2. One or more of these units may be arranged in a different location.

Figure 7:
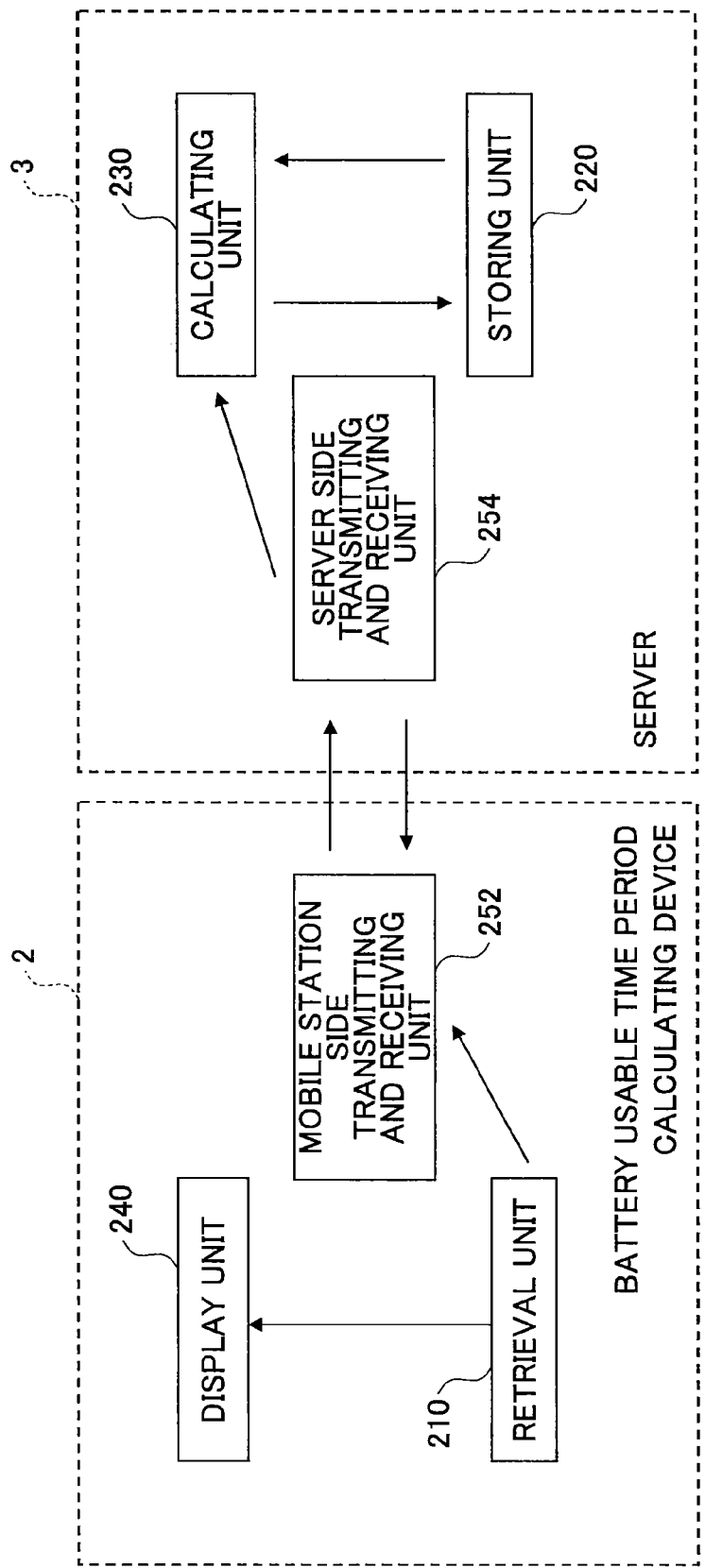
FIG. 7 is a diagram showing a modified example where functions are distributed.

FIG. 7 shows a system of a modified example, in which the functions are distributed between the battery usable time period calculating device 2 and the server 3. Similar to the example shown in FIG. 2, the battery usable time period calculating device 2 includes the retrieval unit 210 and the display unit 240. For elements similar to the elements which are already explained, the same reference numerals are attached, and thereby the duplicated explanations are omitted. Unlike the case shown in FIG. 2, the storing unit 220 and the calculating unit 230 are included in the server 3. Further, in order to communicate information between the battery usable time period calculating device 2 and the server 3 through a network, the battery usable time period calculating device 2 includes a mobile station side transmitting and receiving unit 252, and the server 3 includes a server side transmitting and receiving unit 253. Usually, it is expected that an amount of the information to be stored in the storing unit 220 be quite large. Accordingly, from the viewpoint of simplifying the battery usable time period calculating device 2, it is preferable that the storing unit 220 be included in the server 3, which can be accessed through the network. Additionally, since the calculating unit 230 calculates the battery usable time period by using the information stored in the storing unit 220, it is preferable that the calculating unit 230 be stored in the server 3 together with the storing unit 220. Alternatively, the calculating unit 230 may be included in the battery usable time period calculating device 2, and only the storing unit 220 may be included in the server 3. In this case, the calculating unit 230 may be required to retrieve necessary information from the server 3 through the network.

Figure 8:
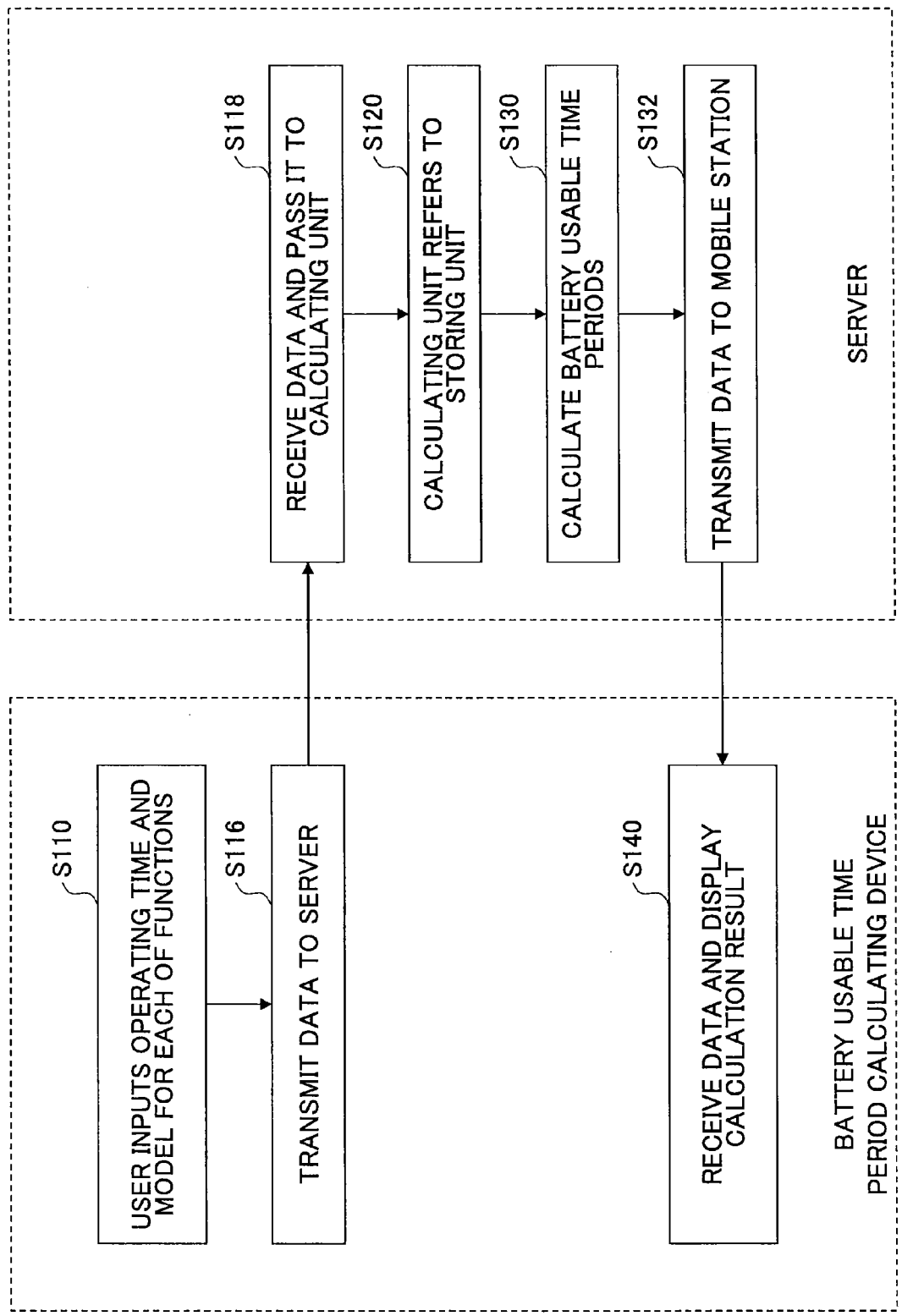
FIG. 8 is a flowchart showing an example of operations in the modified example.

FIG. 8 shows an operation flow for calculating the battery usable time period by this modified example. The operations at steps S110, S120, S130, and S140 are substantially the same as those of explained in FIG. 6. The operation flow is different in the point that steps S120 and S130 are performed in the server 3.

At step S110, the retrieval unit 210 prompts the user to input the information regarding the usage conditions, and in response to this, the user inputs the information.

At step S116, the battery usable time period calculating device 2 transmits the information which is input by the user to the server 3.

At step S118, the server 3 sends the received data to the calculating unit 230.

At step S120, the calculating unit 230 retrieves the fixed values which are used for calculating the battery usable time period from the storing unit 220.

At step S130, the calculating unit 230 calculates the battery usable time period for each of the operating modes.

At step S132, the calculated result is transmitted to the battery usable time period calculating device 2.

At step S140, the display unit 240 displays the calculated result at step S130 to the user.

3. User Input Assistance by Using Model Cases

The mobile station includes many functions. Accordingly, if it were required to input the operating time period and the like for all these functions, there would be concern that the operations would be troublesome. This modified example addresses such a problem.

Figure 9:
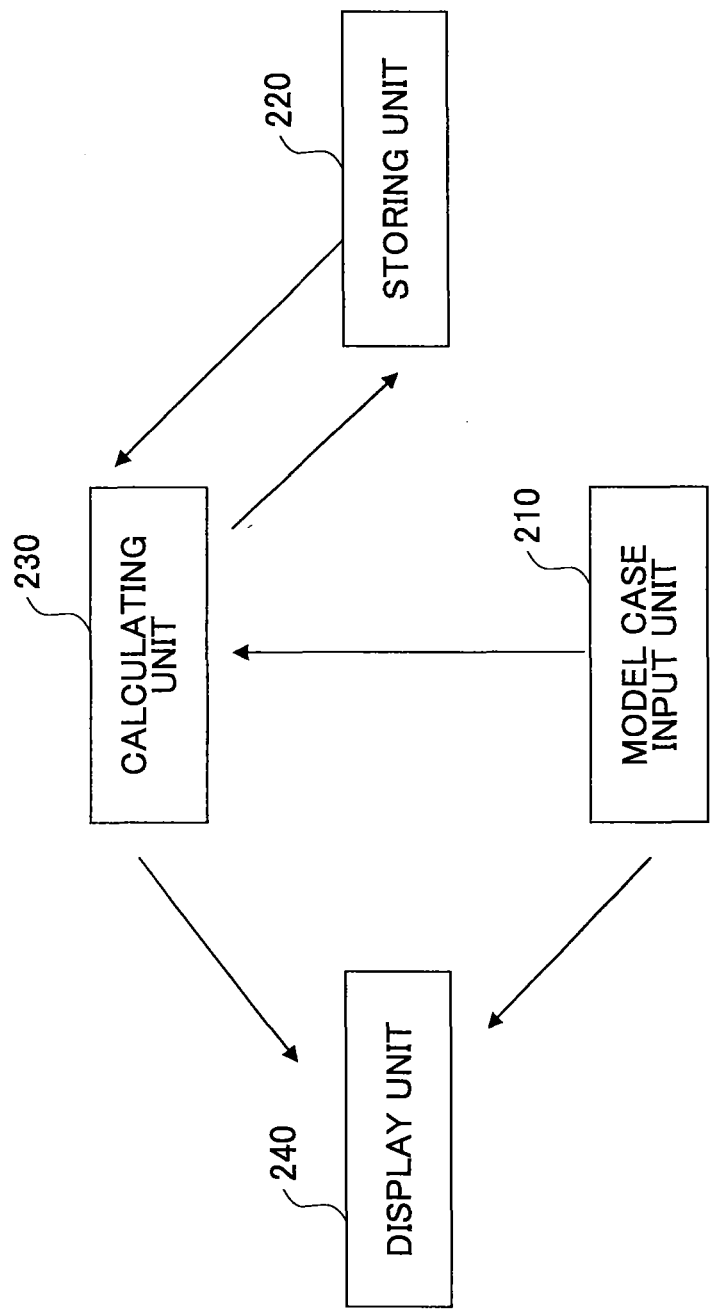
FIG. 9 is a diagram showing a modified example where user input assistance is performed by using a model case.

FIG. 9 is a schematic diagram of the battery usable time period calculating device that is used in the modified example. Generally, the configuration shown in FIG. 9 is the same as the configuration shown in FIG. 2. The configuration shown in FIG. 9 is different from the configuration shown in FIG. 2 in the point that the retrieval unit 210 in FIG. 2 is replaced by a model case input unit 212. For elements similar to the elements which are already explained, the same reference numerals are attached, and thereby the duplicated explanations are omitted. The retrieval unit 210 and the model case input unit 212 are common in the point that they retrieve the information regarding the usage conditions of the user. However, the model case input unit 212 is different in the point that the model case input unit 212 reports information regarding a model case to the calculating unit 230. Here, the model case is designated by the user. A model case is for collectively specifying numerical values which are assumed in advance for various functions of a mobile station.

FIG. 10 shows specific examples of four model cases 1-4. The numerical values shown in the figure are merely examples, and different numerical values may be used. When the user selects one of the model cases 1-4, a group of the numerical values that are assumed in the selected model case is reported to the calculating unit 230 and to the display unit 240. By selecting a model case which is the most similar to the user's own usage trend, instead of manually inputting the operating time periods of the various functions one by one, the user can easily provide the information regarding the usage conditions to the battery usable time period calculating device 2.

The numerical values designated in the model case may be input to the calculating unit 230 and the like as they are. Alternatively, the numerical values indicated in the model case may be edited by the user. For example, the user selecting the model case 2 may change the operating time period of the one seg from 13 minutes/day to 30 minutes/day, and thereby the changed numerical value regarding the operating time period of the one seg and the numerical values of other functions which are left unchanged may be reported to the calculating unit 230 and the like.

FIG. 11 shows the operation flow for calculating the battery usable time period.

At step S112, the user selects one of the plural model cases, and the user selects the model information of the mobile station. By doing this, the group of the numerical values which are assumed in the selected model case is reported to the calculating unit 230 and to the display unit 240.

At step S120, the calculating unit 230 retrieves the fixed values from the storing unit 220. The fixed values are used for calculating the battery usable time period.

At step S130, the calculating unit 230 calculates the battery usable time period for each of the operating modes.

At step S140, the display unit 240 displays the calculation result at step S130 to the user.

4. Use History Information of Mobile Station

Similar to the above-described modified example for reducing the load of the manual input by the user by using the model cases, this modified example makes it easier to report the information regarding the usage conditions to the calculating unit 230 and the like.

Figure 12:
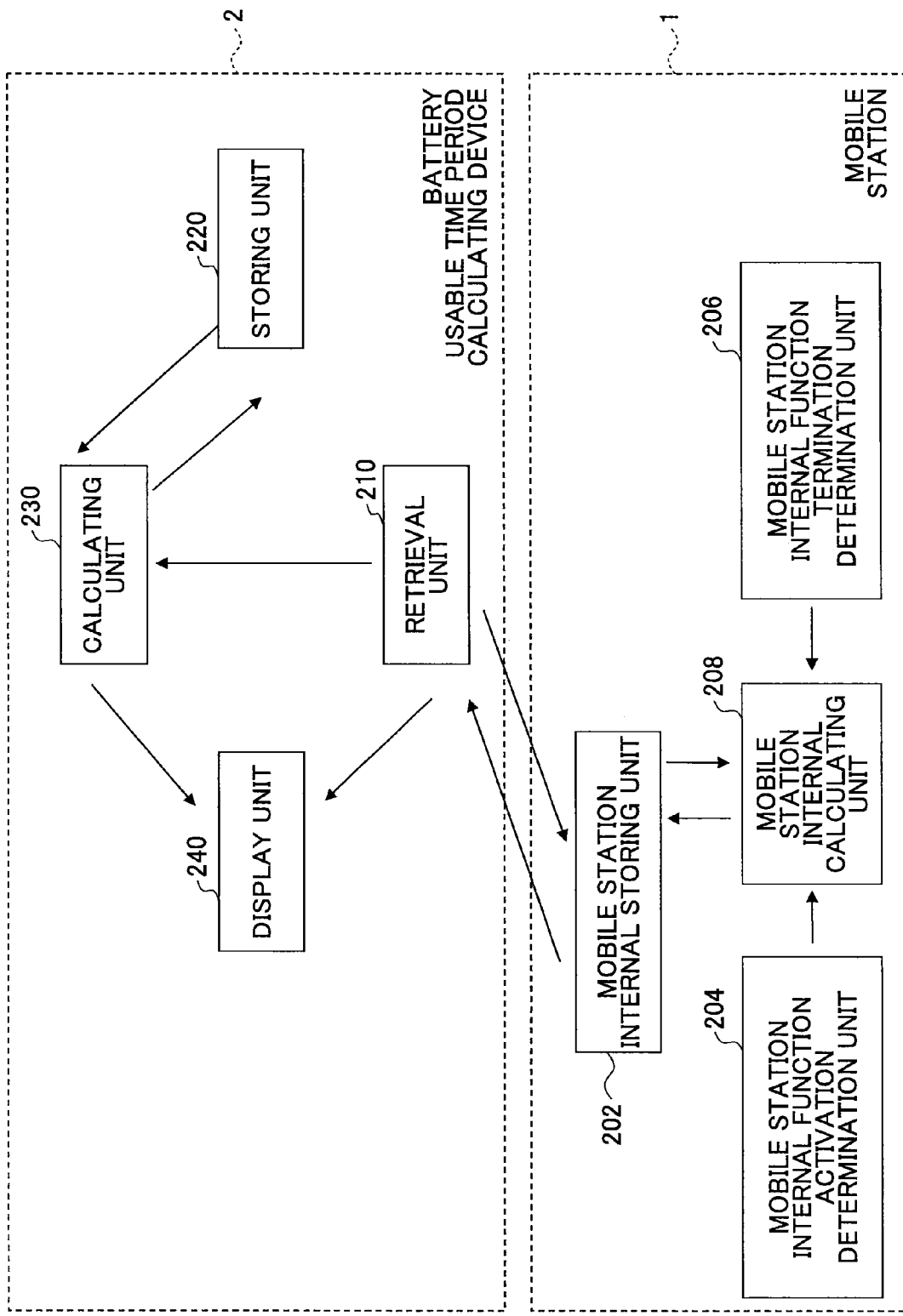
FIG. 12 is a schematic diagram of a system used in a modified example where information regarding use history of the mobile station is introduced.

FIG. 12 shows a schematic diagram of the system used in this modified example. Generally, it is the same as the example shown in FIG. 2, but it is different in the point that a mobile station internal storing unit 202; a mobile station internal function 204; a mobile station internal function termination determination unit 206; and a mobile station internal calculating unit 208 are included in the side of the mobile station 1. For elements similar to the elements which are already explained, the same reference numerals are attached, and thereby the duplicated explanations are omitted.

The mobile station internal storing unit 202 accumulates use history information for a case where the user uses the mobile station. The use history information can be used as a basis of the information regarding the usage conditions in the present application. Namely, each time the user uses each of the various functions included in the mobile station, the information regarding the usage conditions is updated in the mobile station internal storing unit 202.

FIG. 13 shows information stored in the mobile station internal storing unit 202. Usually, the use history information is stored together with information about the time at which the function is used (e.g., date and time of call origination/reception, and date and time of transmission/reception). In FIG. 13, the portion that is used as the information regarding the usage conditions is extracted.

The mobile station internal function activation determination unit 204 makes determination that some functions included in the mobile station are activated, together with the determination of the information about the date and time.

The mobile station internal function termination determination unit 206 determines that the user terminates using some functions, together with the determination of the information about the date and time.

The mobile station internal calculating unit 208 extracts the information regarding the usage conditions, based on the information determined by the mobile station internal activation determination unit 204 and the information determined by the mobile station internal termination determination unit 206, and provides the information regarding the usage conditions to the mobile station internal storing unit 202.

Figure 14:
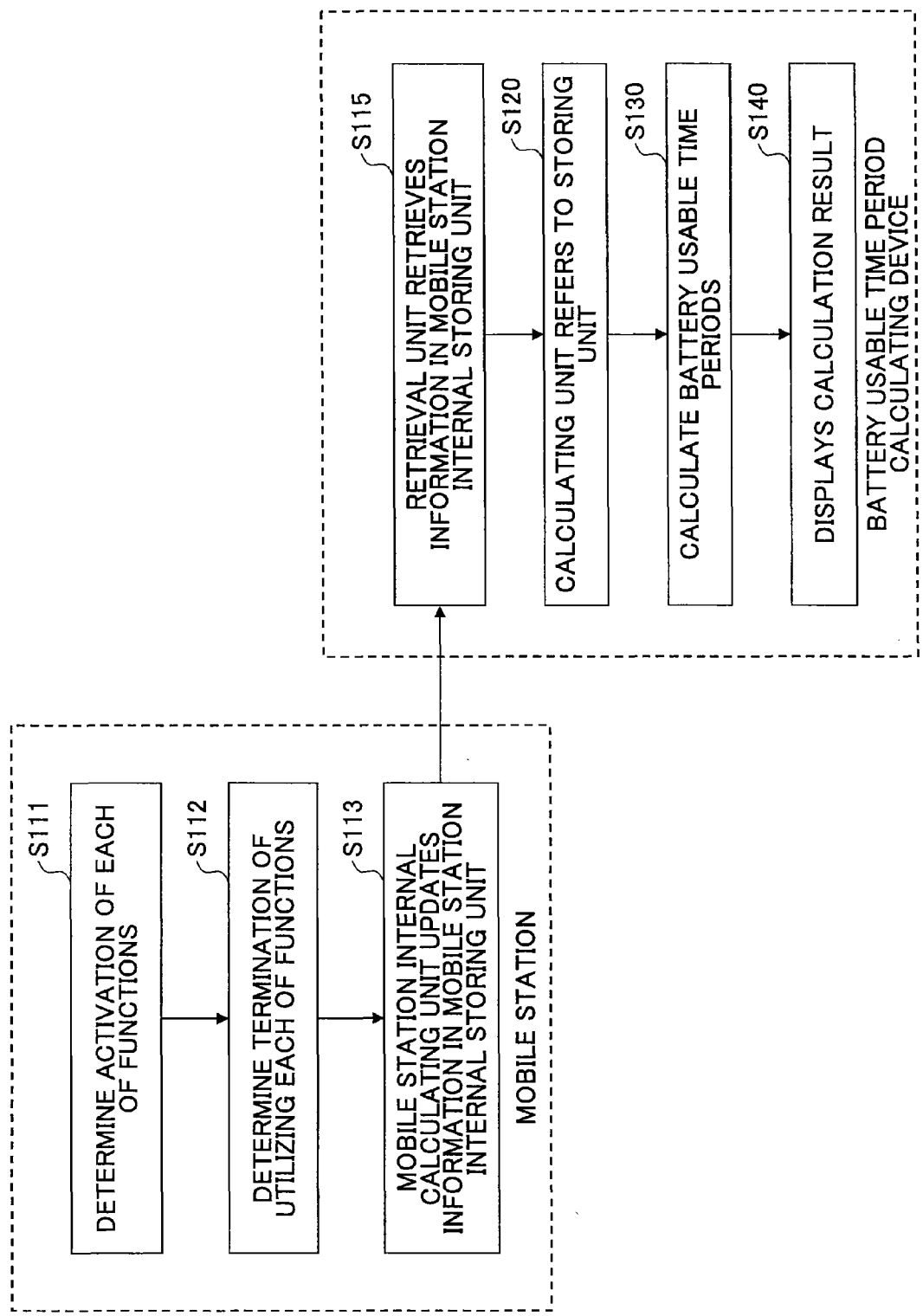
FIG. 14 is a flowchart showing an example of operations in the modified example.

FIG. 14 shows the operation flow for calculating the battery usable time period by the modified example. Operations at steps S120, S130, and S140 are substantially the same as those of explained in FIG. 6.

At step S111, the mobile station internal function activation determination unit 204 determines that the user starts using some functions, together with the data and time. For example, when a call is started, the activation of the voice communication function and information about the call origination history or the call reception history are obtained. For a case where an e-mail is transmitted or received, the mobile station internal function activation determination unit 204 determines that the transmission or reception of the e-mail is performed.

At step S112, the mobile station internal function termination determination unit 206 determines that the user terminates using some functions, together with the date and time. For example, for a case where a call is terminated, information regarding the termination of using the voice communication function and the like is obtained.

At step S113, the mobile station internal calculating unit 208 updates the information regarding the usage condition by adding the use history information of the functions. Here, the mobile station internal function activation determination unit 204 and the mobile station internal function termination determination unit 206 determine that the functions are used. For example, when the user makes a call, information regarding history of the call origination/reception is added as the use history information, and the information regarding the usage conditions is updated by the information about the duration of the call. Further, for a case where the user transmits or receives a mail, the number of times of transmitting mails or the number of times of receiving mails is updated (incremented).

At step S115, the retrieval unit 210 of the battery usable time period calculating device 2 accesses the mobile station internal storing unit 202, and the retrieval unit 210 retrieves the information regarding the usage conditions.

At step S120, the calculating unit 230 retrieves the fixed values from the storing unit 220. The fixed values are used for calculating the battery usable time period.

At step S130, the calculating unit 230 calculates the battery usable time period for each of the operating modes.

At step S140, the display unit 240 displays the calculation result at step S130 to the user.

5. Comparison of Mobile Stations

Figure 15:
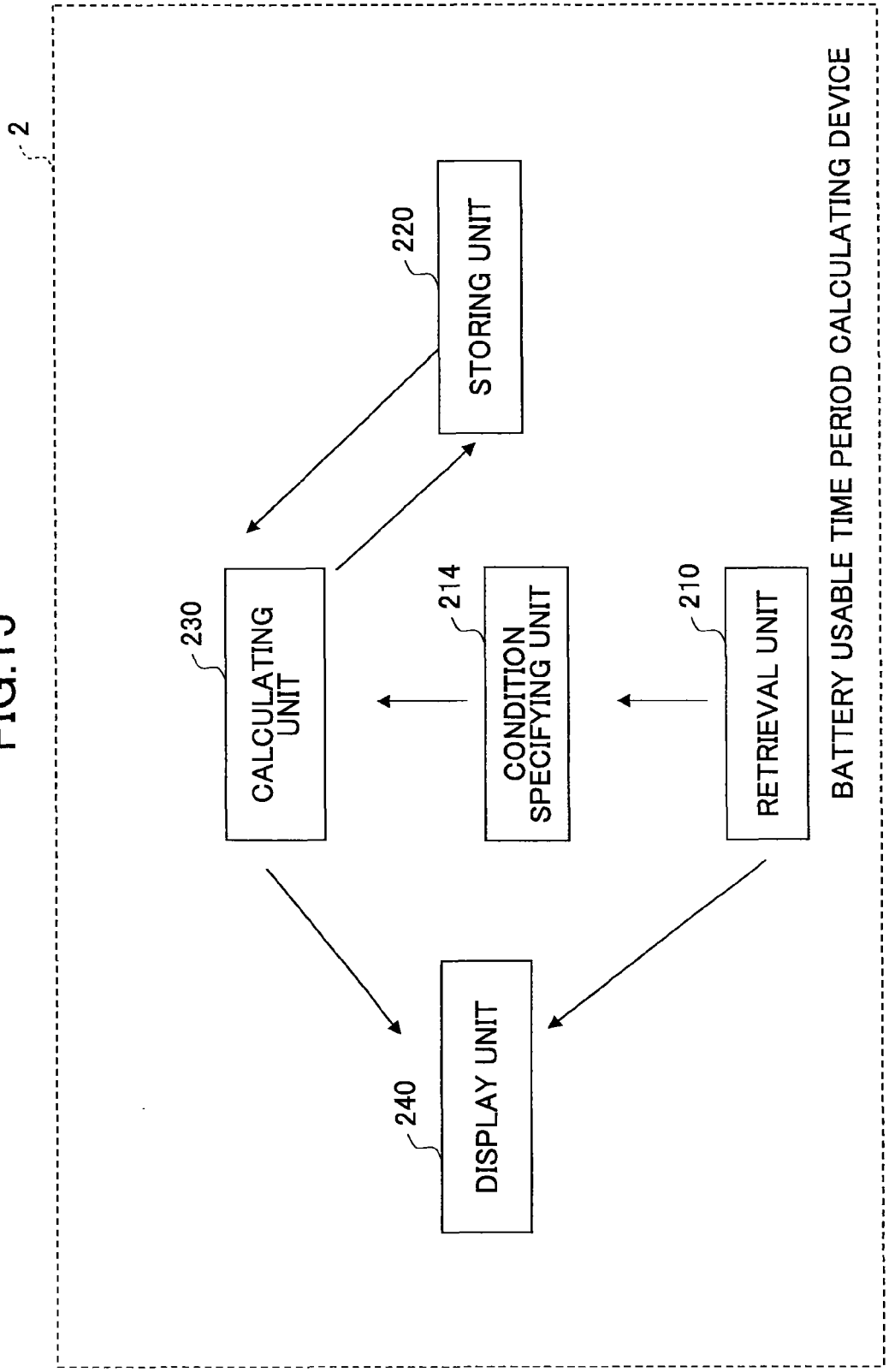
FIG. 15 is a diagram showing a modified example where mobile stations are compared.

FIG. 15 shows a schematic diagram of the battery usable time period calculating device that is used for this modified example. Generally, the configuration shown in FIG. 15 is the same as the configuration shown in FIG. 2. The configuration shown in FIG. 15 is different in the point that a condition specifying unit 214 is shown in FIG. 15. For elements similar to the elements which are already explained, the same reference numerals are attached, and thereby the duplicated explanations are omitted.

The condition specifying unit 214 prompts the user to designate target mobile stations for which the corresponding battery usable time periods are calculated, based on the information retrieved by the retrieval unit 210. The number of the target mobile stations may be any number. For example, the user specifies plural mobile stations. The user is considering the purchase of the mobile stations. For deciding the model to be purchased, it is expected that the battery usable time periods be considered.

Figure 16:
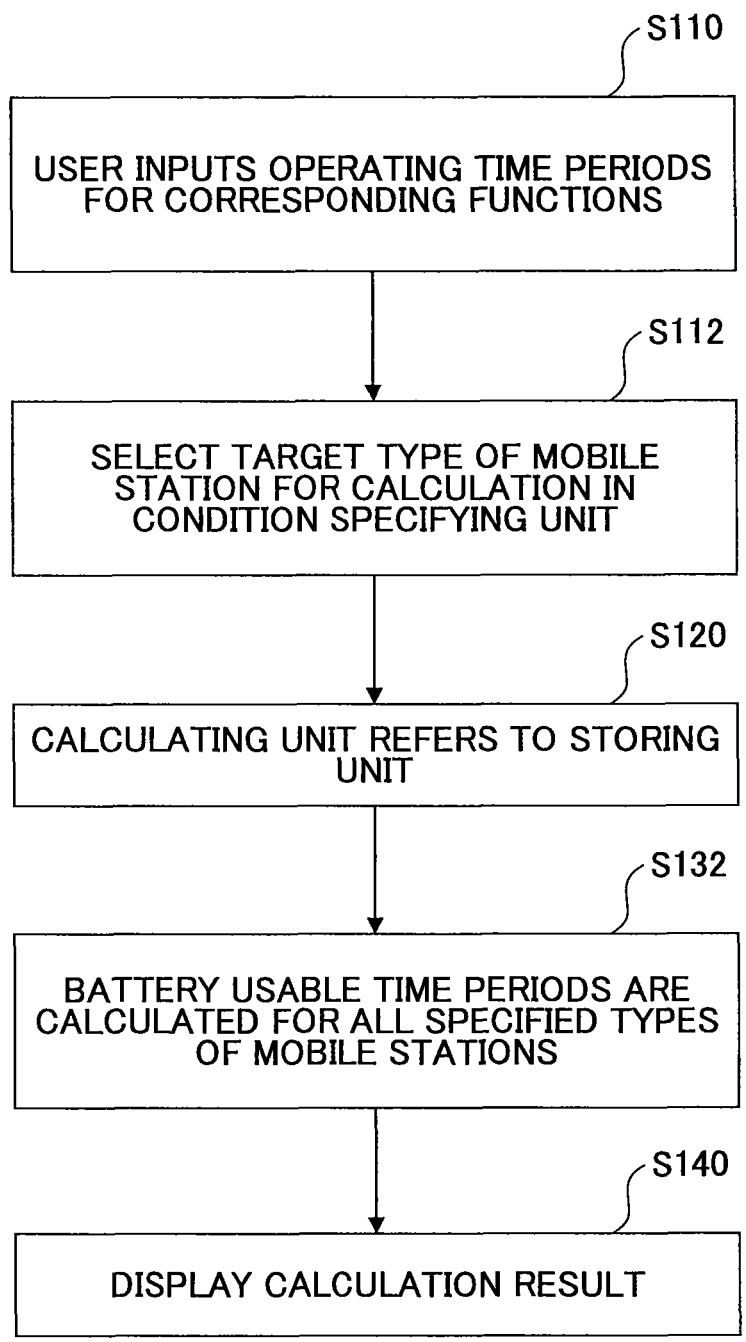
FIG. 16 is a flowchart showing an example of operations in the modified example.

FIG. 16 shows the operation flow for calculating the battery usable time periods by this modified example. Operations at steps S110 and S120 are substantially the same as those of explained in FIG. 6.

At step S110, the retrieval unit 210 prompts the user to input the information regarding the usage conditions, and in response to this, the user inputs the information.

At step S112, the condition specifying unit 214 prompts the user to selects the target models. The number of the target models is greater than or equal to one.

At step S120, the calculating unit 230 retrieves the fixed values from the storing unit 220. The fixed values are used for calculating the battery usable time periods.

At step S130, the calculating unit 230 calculates, for each of the models, the battery usable time periods for the corresponding operating modes.

At step S140, the display unit 240 displays the calculation results of the corresponding models at step S130 to the user. By doing this, the user can find the battery usable time period of each of the one or more models, which are specified by the user. The information regarding the battery usable time periods may be used as the basis of the decision.

6. Mobile Station Having an Operating Mode Automatic Switching Function

Among mobile stations that operate in plural operating modes, there are some mobile stations that operate such that prior to the capacity value of the battery reaching a threshold value, the mobile station operates in the normal mode, and subsequent to the capacity value of the battery becoming less than the threshold value, the mobile station operates in the power saving mode. For the case of such a mobile station, the battery usable time period may be represented by a summation of the battery usable time period in the normal mode and the battery usable time period in the power saving mode. In this modified example, the battery usable time periods are calculated for such a mobile station.

Figure 17:
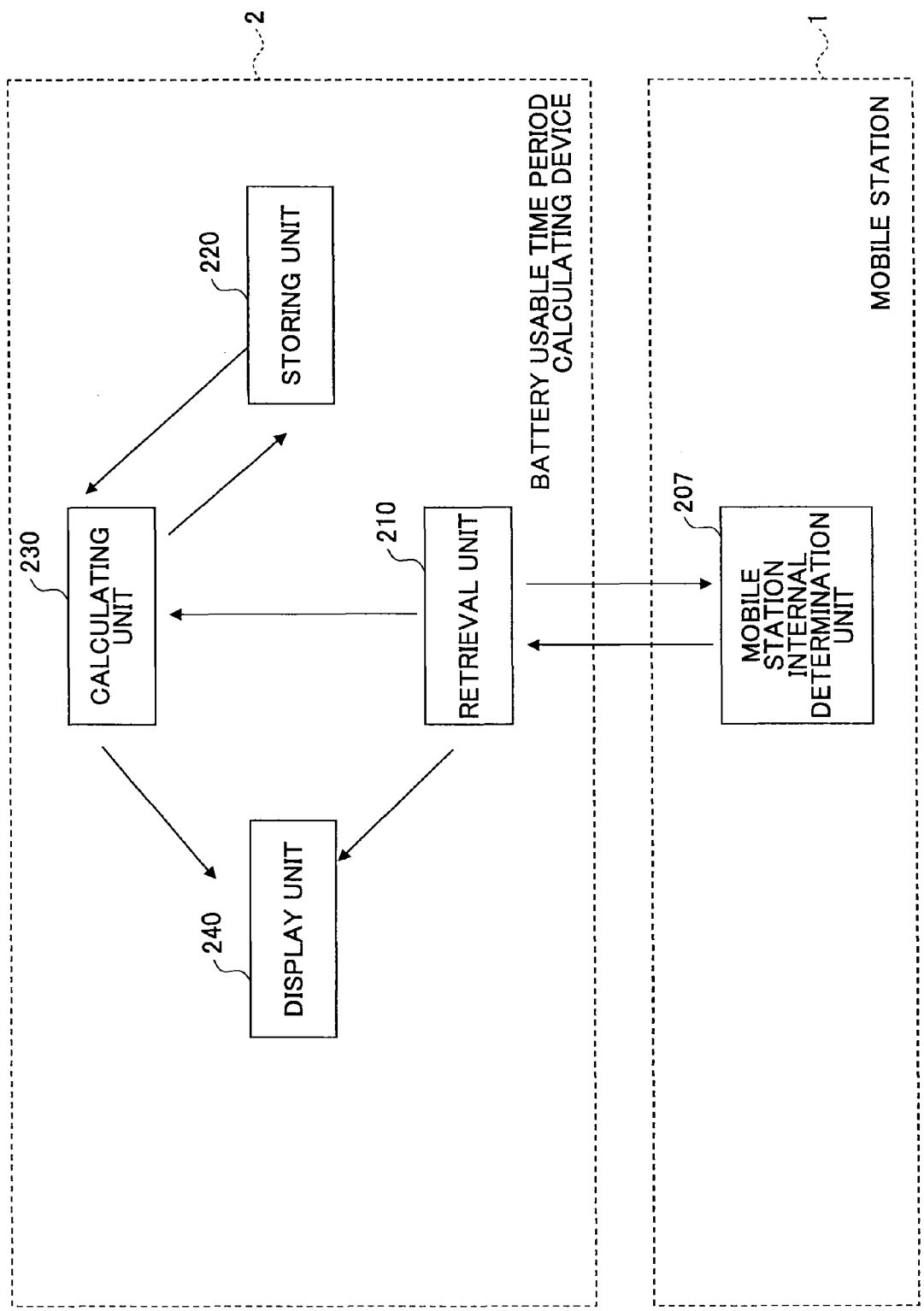
FIG. 17 is a diagram showing a modified example of a case where the mobile station includes an operating mode automatic switching function.

FIG. 17 shows a schematic diagram of the system which is used in this modified example. The configuration shown in FIG. 17 is substantially the same as the configuration shown in FIG. 2. The configuration shown in FIG. 17 is different in the point that a mobile station internal determination unit 207 is shown inside the mobile station 1 in FIG. 17. For elements similar to the elements which are already explained, the same reference numerals are attached, and thereby the duplicated explanations are omitted.

The mobile station internal determination unit 207 monitors the capacity value of the battery used in the mobile station 1. The mobile station internal determination unit 207 reports control signals to a controller (not shown), so that the mobile station 1 operates in the normal mode prior to the capacity value of the battery reaching the threshold value, and the mobile station 1 operates in the power saving mode when the capacity value of the battery is less than the threshold value.

The retrieval unit 210 retrieves information regarding the threshold value from the mobile station internal determination unit 207. The information regarding the usage condition of each of the functions is retrieved by the retrieval unit 210 through an input of the user, through the model case, or from the mobile station internal storing unit (which is not shown in FIG. 17).

The storing unit 220 stores the fixed values in advance. The fixed values are used for calculating the battery usable time period.

The calculating unit 230 calculates the battery usable time periods for the corresponding operating modes, and the calculating unit 230 calculates an integrated battery usable time period by adding these. Specifically, the calculating unit 230 calculates the added value which is obtained by adding the product of the average consumed current value for one of the functions and the operating time period of the one of the functions over all the functions included in the mobile station, and the calculating unit 230 divides the capacity value of the battery of the mobile station by the added value. By performing such a process for each of the operating modes, and by adding the battery usable time periods of the corresponding operating modes, the integrated battery usable time period is calculated.

(The battery usable time period)=(the capacity value of the battery in the normal mode)/($\Sigma$[(the average consumed current value of the function in the normal mode)×(the operating time period of the function)])+(the capacity value of the battery in the power saving mode)/($\Sigma$[(the average consumed current value of the function in the power saving mode)×(the operating time period of the function)]).

The capacity value of the battery in the power saving mode can be found from the threshold value which is retrieved by the retrieval unit 210 from the mobile station internal determination unit 207.

The display unit 240 displays the battery usable time period of the mobile station, which is calculated by the calculating unit 230.

Figure 18:
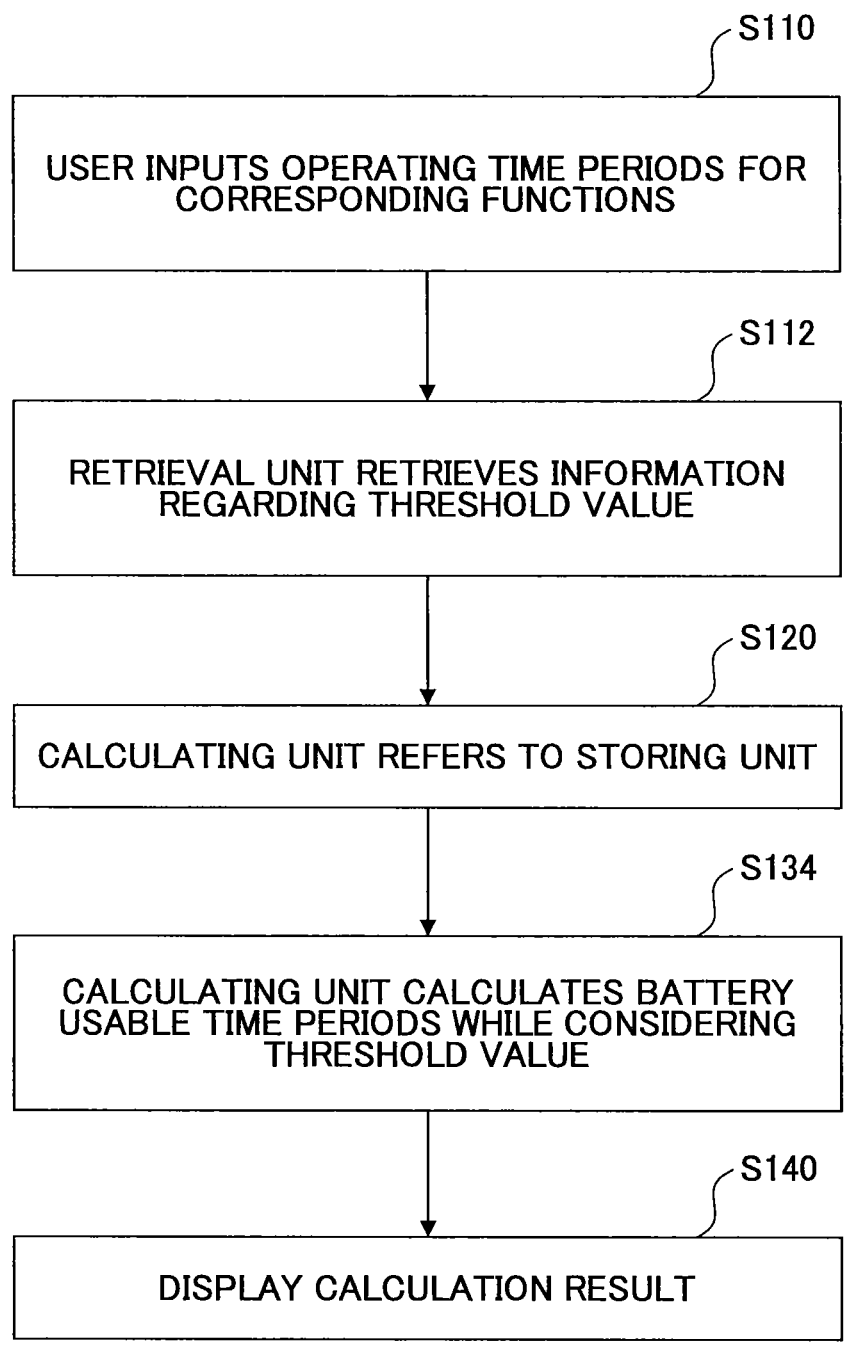
FIG. 18 is a flowchart showing an example of operations in the modified example.

FIG. 18 shows the operation flow for calculating the battery usable time period by the modified example. Operations at steps S110 and S120 are substantially the same as those of explained in FIG. 6.

At step S110, the retrieval unit 210 prompts the user to input the information regarding the usage condition, and in response to this the user inputs the information.

At step S112, the retrieval unit 210 retrieves the threshold value from the mobile station internal determination unit 207.

At step S120, the calculating unit 230 retrieves the fixed values from the storing unit 220. The fixed values are used for calculating the battery usable time period.

At step S134, the calculating unit 230 calculates the battery usable time period by using the capacity value of the battery which is greater than or equal to the threshold value and the capacity value of the battery which is less than the threshold value.

At step S140, the display unit 240 displays the calculation result at step S130 to the user.

7. Deterioration of the Battery

As the charging and discharging of the battery are repeated, the capacity value of the battery is gradually degraded. Accordingly, the battery usable time period for the mobile station that has been used for a long time while repeating the charging and discharging is smaller than a battery usable time period for a new mobile station. In this modified example, the battery usable time period is calculated while considering such deterioration of the battery.

Figure 19:
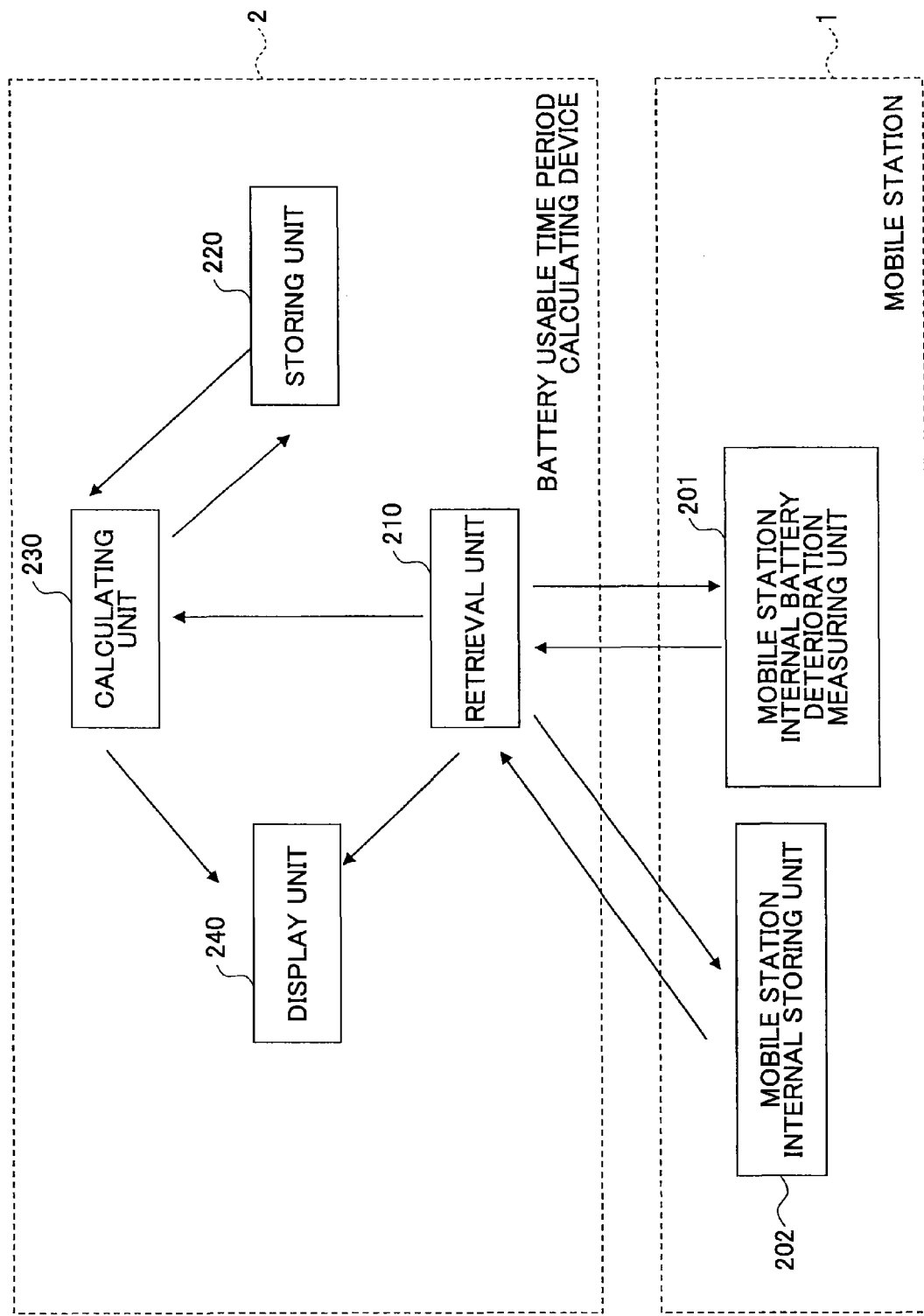
FIG. 19 is a diagram showing a modified example where deterioration of the battery is considered.

FIG. 19 shows a schematic diagram of the system which is used in this modified example. It is substantially the same as the example shown in FIG. 2. It is different in the point that a mobile station internal battery deterioration measuring unit 201 and the mobile station internal storing unit 202 are shown in the mobile station 1. For elements similar to the elements which are already explained, the same reference numerals are attached, and thereby the duplicated explanations are omitted.

The mobile station internal battery deterioration measuring unit 201 measures to what extent the battery is deteriorated. Information regarding the deterioration is retrieved by the retrieval unit 210.

The mobile station internal storing unit 202 accumulates the use history and the information regarding the usage conditions for the case where the user utilizes the mobile station.

Figure 20:
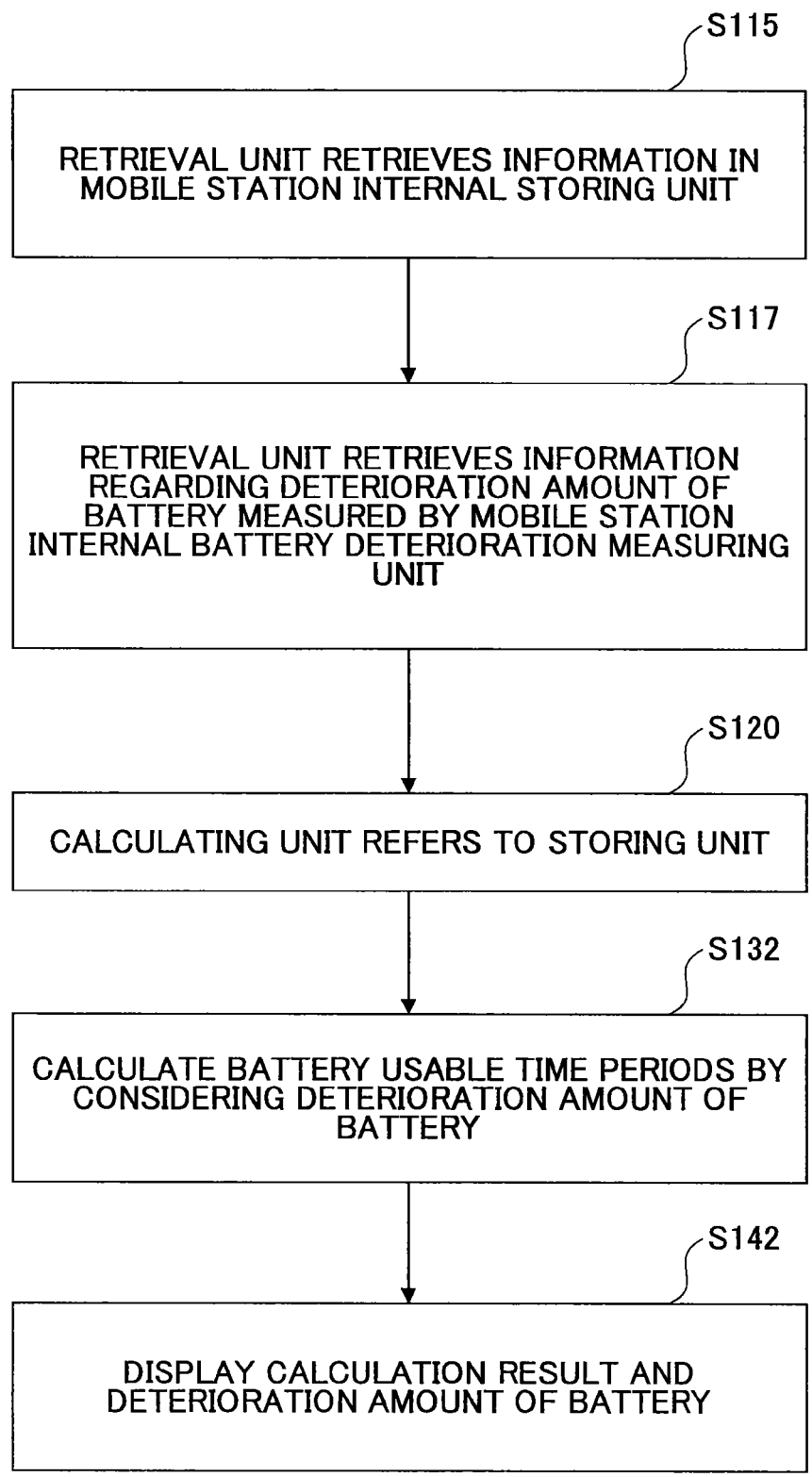
FIG. 20 is a flowchart showing an example of operations in the modified example.
Figure 21:
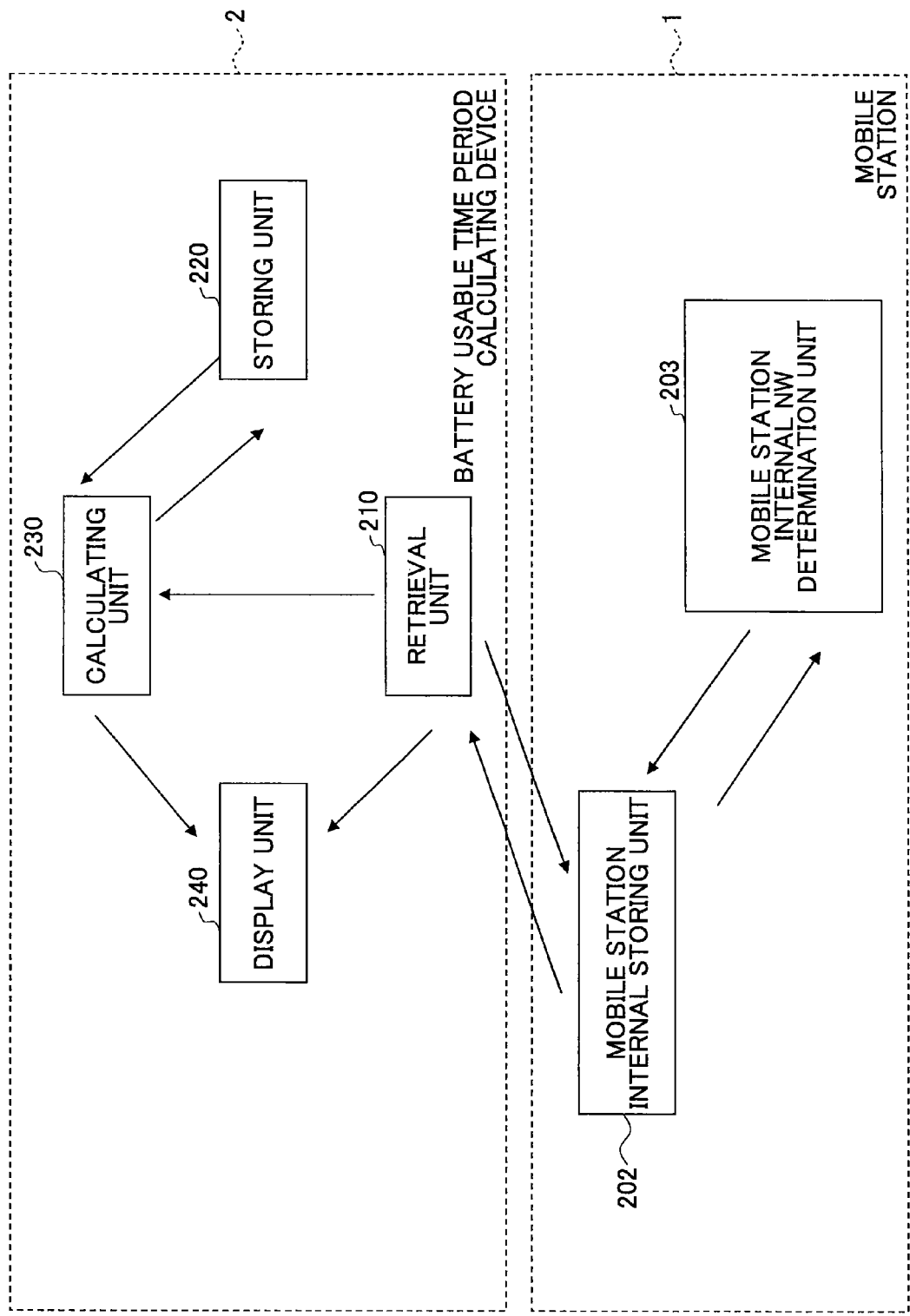
FIG. 21 is a diagram showing a modified example where a serving network is considered.

FIG. 20 shows the operation flow for calculating the battery usable time period by this modified example.

At step S115, the retrieval unit 210 retrieves the information of the mobile station internal storing unit 202 (the information regarding the usage conditions). Here, the user may input the information regarding the usage conditions to the retrieval unit 210.

At step S117, the retrieval unit 210 retrieves the information regarding the deterioration of the battery, which is measured by the mobile station internal battery deterioration measuring unit 201.

At step S120, the calculating unit 230 retrieves the fixed values from the storing unit 220. The fixed values are used for calculating the battery usable time period.

At step S132, the calculating unit 230 calculates the battery usable time periods for the corresponding operating modes. In this case, depending on a deterioration amount of the battery, the battery usable time periods are calculated while setting the capacity value of the battery to be small to some extent. The battery usable time period is calculated in accordance with the following formula.

(The battery usable time period)=(the capacity value of the battery)/($\Sigma$[(the average consumed current value for the function)×(the operating time period of the function)]).

As an example, similar to the conditions explained in "1. Basic configuration," suppose that the capacity of a new battery is 800 mAh, and that the operating time periods and the average consumed current values of the corresponding functions are as follows.

Voice communication function: the operating time period=20 minutes/day, the average consumed current value=150 mA Mail transmitting function: 10 times/day, the average consumption per one time=5 mAh Mail receiving function: 15 times/day, the average consumption per one time=2 mAh Standby time: 1400 minutes/day, the average consumed current value=1.0 mA In this case, the battery usable time period which is calculated by the example in the basic embodiment is the following value.

The battery usable time period (h)=800 (mAh)/(20×150/60+10×5+15×2+1400×1.0/60)×24≈125 (h).

For the case of this embodiment, the capacity value of the battery is set to be a value which is less than 800 mAh, in response to the deteriorated amount of the battery. For example, instead of 800 mAh, it is set to be 500 mAh. As a result, the battery usable time period becomes smaller as follows.

The battery usable time period (h)=500 (mAh)/(20×150/60+10×5+15×2+1400×1.0/60)×24≈78 (h).

At step S142, the display unit 240 displays the calculation result at step S132 together with the deterioration amount of the battery to the user.

8. Serving Networks

Some mobile stations can operate in plural networks. For the case of such a mobile station, it is expected that the battery usable time period vary depending on the networks. In this modified example, the battery usable time periods are calculated while considering the differences among the networks.

Figure 22:
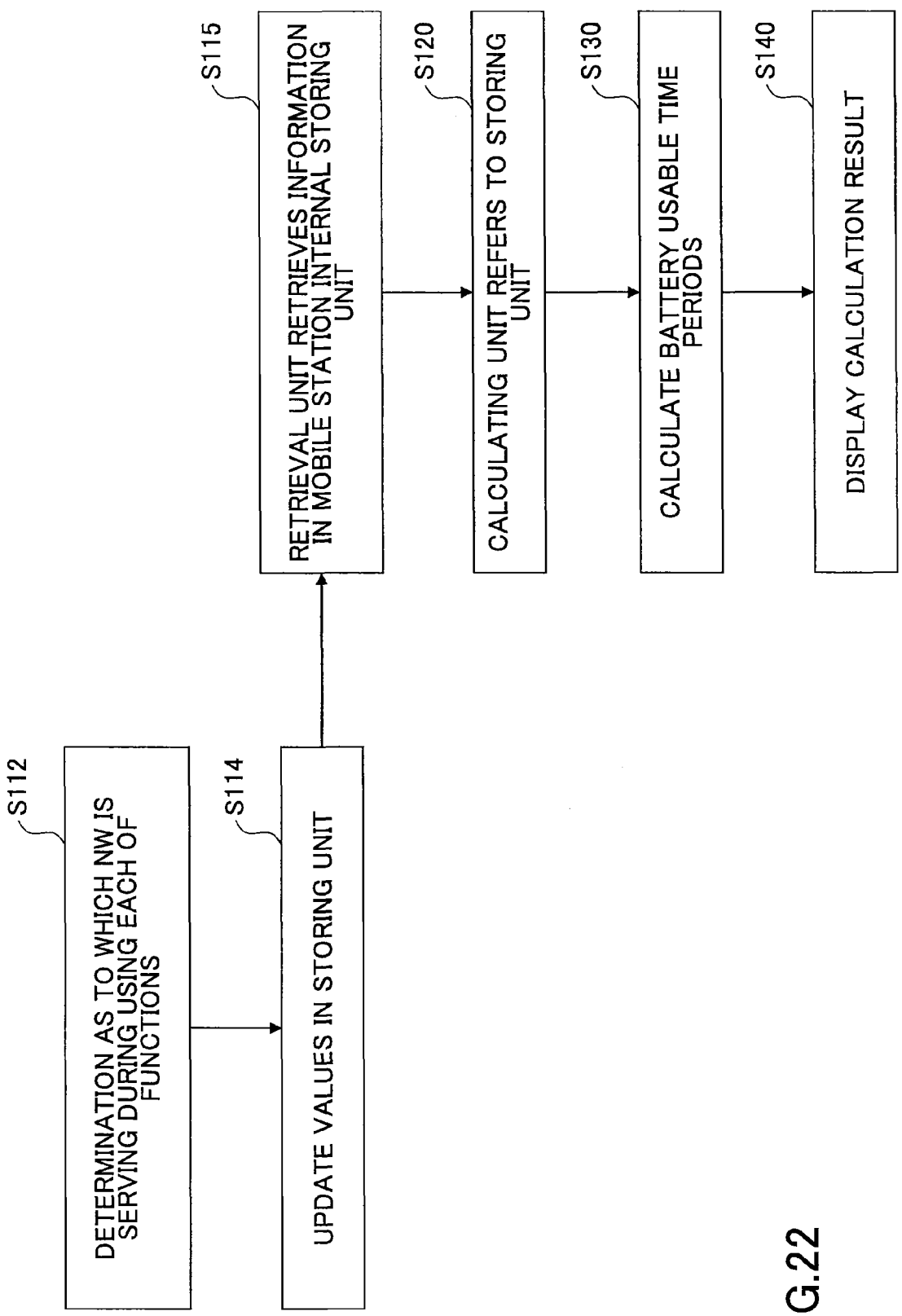
FIG. 22 is a flowchart showing an example of operations in the modified example.

FIG. 22 shows a schematic diagram of the system used in this modified example. It is substantially the same as the example shown in FIG. 2. It is different in the point that the mobile station internal storing unit 202 and a mobile station internal NW determination unit 203 are shown in the mobile station 1. For elements similar to the elements which are already explained, the same reference numerals are attached, and thereby the duplicated explanations are omitted.

The mobile station internal storing unit 202 accumulates use history of cases where the user utilizes the mobile station and the information regarding the usage conditions.

The mobile station internal NW determination unit 203 determines which network is serving the mobile station 1. The mobile station internal NW determination unit 203 reports the determination result to the mobile station internal storing unit 202. The determination result is stored in the mobile station internal storing unit 202 as the information regarding the usage conditions. Namely, the information regarding the operating time and the like for each of the functions of the mobile station is managed for each of the networks.

FIG. 22 shows the operation flow for calculating the battery usable time periods according to this modified example.

At step S112, the mobile station internal NW determination unit 203 determines the network that serves the mobile station, and the mobile station internal NW determination unit 203 reports it to the mobile station internal storing unit 202.

At step S114, the information in the mobile station internal storing unit 202 (the information regarding the usage conditions) is updated. As described above, the information regarding the usage conditions is managed for each of the networks.

At step S115, the retrieval unit 210 retrieves the information in the mobile station internal storing unit 202 (the information regarding the usage conditions).

At step S120, the calculating unit 230 retrieves the fixed values from the storing unit 220. The fixed values are used for calculating the battery usable time periods.

At step S130, the calculating unit 230 calculates the battery usable time period for each of the operating modes.

At step S140, the display unit 240 displays the calculation result at step S130 to the user while indicating the network.

Hereinabove, the present invention is explained by referring the specific embodiments. However, the embodiments are merely illustrative, and variations, modifications, alterations and substitutions could be conceived by those skilled in the art. Specific examples of numerical values are in order to facilitate understanding of the invention. However, these numerical values are simply illustrative, and any other appropriate values may be used, except as indicated otherwise. Specific examples of the formulas have been used in order to facilitate understanding of the invention. However, these formulas are simply illustrative, and any other appropriate formulas may be used, except as indicated otherwise. The separations of the embodiments or the items are not essential to the present invention. Depending on necessity, subject matter described in two or more items may be combined and used, and subject matter described in an item may be applied to subject matter described in another embodiment or item (provided that they do not contradict). Especially, in any two of FIGS. 2, 7, 9, 12, 15, 17, 19, and 21, even if an element shown in one of the two figures is not shown in the other figure, it shall not be interpreted that the element is not considered to be an element included in the mobile station or the battery usable time period calculating device. The element may be the element included in the mobile station or the battery usable time period calculating device shown in the other figure, provided that the element does not contradict the other figure. For the convenience of explanation, the devices according to the embodiments of the present invention are explained by using functional block diagrams. However, these devices may be implemented in hardware, software, or combinations thereof. The software may be prepared in any appropriate storing medium, such as a random access memory (RAM), a flash memory, a read only memory (ROM), an EPROM, an EEPROM, a register, a hard disk drive (HDD), a removable disk, a CD-ROM, a database, a server, and the like. The present invention is not limited to the above-described embodiments, and various variations, modifications, alterations, substitutions and so on are included, without departing from the spirit of the present invention.

The present international application claims priority based on Japanese Patent Application No. 2011-6052, filed on Jan. 14, 2011, the entire contents of which are hereby incorporated by reference.

LIST OF REFERENCE SYMBOLS

1: Mobile station
2: Battery usable time period calculating device
3: Server
201: Mobile station internal battery deterioration measuring unit
202: Mobile station internal storing unit
203: Mobile station internal NW determination unit
204: Mobile station internal function
206: Mobile station internal function termination determination unit
207: Mobile station internal determination unit
208: Mobile station internal calculating unit
210: Retrieval unit
212: Model case input unit
214: Condition specifying unit
220: Storing unit
230: Calculating unit
240: Display unit
252: Mobile station side transmitting and receiving unit
254: Server side transmitting and receiving unit

The invention claimed is:

1. A device configured to calculate a battery usable time period of a mobile station, the device being provided separately from the mobile station, the device comprising:
circuitry configured to
retrieve information regarding usage conditions including operating time periods, the operating time periods indicating extents of utilizing corresponding plural functions included in the mobile station by a user;
store, for each of operating modes of the mobile station, average consumed current values for the corresponding plural functions;
calculate, for each of the operating modes, the battery usable time period by calculating an added value, the added value being obtained by adding a product of the average consumed current value for one of the functions and the operating time period of the one of the functions over the plural functions, and by dividing a capacity value of a battery included in the mobile station by the added value;
control a display to display the battery usable time periods of the mobile station to the user;
retrieve, for each of networks by which the mobile station was served, the information for the operating time periods of the corresponding plural functions from the mobile station; and
calculate the battery usable time periods for each of the networks.

2. The device according to claim 1, wherein
the device includes circuitry configured to calculate a usable time period and a server, the circuitry configured to calculate a usable time period and the server being able to communicate with each other, and
the circuitry configured to store and the circuitry configured to calculate are stored in the server.

3. The device according to claim 1, wherein
the circuitry is configured to accept an input by the user, the input specifying one of plural model cases, and
the plural model cases designate operating time periods of the corresponding plural functions in advance.

4. The device according to claim 1, wherein
the circuitry is configured to retrieve the information regarding the operating time periods of the corresponding plural functions from the mobile station.

5. The device according to claim 1, wherein the circuitry is configured to:
accept an input by the user, the input specifying a plurality of mobile stations;
calculate, for each of the plurality of mobile stations, the battery usable time periods for the corresponding operating modes; and
control the display to display the battery usable time periods for each of the plurality of mobile stations.

6. The device according to claim 1, wherein
for a case where the mobile station includes a function that switches the operating modes of the mobile station to a power saving mode when a remaining amount of the battery becomes less than a threshold value, the circuitry is configured to
retrieve the threshold value from the mobile station;
calculate a first battery usable time period for a normal operating mode until the remaining amount of the battery reaches the threshold value, and subsequent to the remaining amount of the battery reaching the threshold value, calculate a second battery usable time period for the power saving mode; and
control the display to display a total of the first battery usable time period and the second battery usable time period.

7. The device according to claim 1, wherein
for a case where the mobile station is configured to measure deterioration of the battery, the circuitry is configured to
retrieve deterioration information indicating the deterioration of the battery; and
calculate the battery usable time periods while decreasing the capacity value of the battery by an amount corresponding to the deterioration of the battery.

8. A method performed by a device configured to calculate a battery usable time period of a mobile station, the device being provided separately from the mobile station, the method comprising:
retrieving information regarding usage conditions including operating time periods, the operating time periods indicating extents of utilizing corresponding plural functions included in the mobile station by a user;
storing, for each of operating modes of the mobile station, average consumed current values for the corresponding plural functions;
calculating, for each of the operating modes, the battery usable time period by calculating an added value, the added value being obtained by adding a product of the average consumed current value for one of the functions and the operating time period of the one of the functions over the plural functions, and by dividing a capacity value of a battery included in the mobile station by the added value;
controlling a display to display the battery usable time periods of the mobile station to the user;
retrieving, for each of networks by which the mobile station was served, the information for the operating time periods of the corresponding plural functions from the mobile station; and
calculate the battery usable time periods for each of the networks.

9. The device according to claim 1, wherein
the circuitry is configured to receive an input by the user, the input corresponding to a selection of a plurality of mobile stations.

10. The device according to claim 9, wherein
the circuitry is configured to store the average consumed current value for each of the operating modes for each of the plurality of mobile stations.

11. The device according to claim 10, wherein
the circuitry is configured to calculate the battery usable time period for each of the operating modes of each of the plurality of mobile stations.

12. The device according to claim 11, wherein
the circuitry is configured to control the display to display the battery usable time period for each of the operating modes of each of the plurality of mobile stations.

* * * * *